(12) United States Patent
Kobayashi et al.

(10) Patent No.: US 10,818,506 B2
(45) Date of Patent: Oct. 27, 2020

(54) ETCHING METHOD AND RESIDUE REMOVAL METHOD

(71) Applicant: TOKYO ELECTRON LIMITED, Tokyo (JP)

(72) Inventors: Noriyuki Kobayashi, Nirasaki (JP); Toshinori Debari, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 134 days.

(21) Appl. No.: 16/026,589

(22) Filed: Jul. 3, 2018

(65) Prior Publication Data

US 2019/0013207 A1 Jan. 10, 2019

(30) Foreign Application Priority Data

Jul. 6, 2017 (JP) .................................. 2017-133039

(51) Int. Cl.
| | | |
|---|---|---|
| *H01L 21/311* | (2006.01) | |
| *H01L 21/677* | (2006.01) | |
| *H01L 21/02* | (2006.01) | |
| *H01L 21/67* | (2006.01) | |
| *H01L 21/3105* | (2006.01) | |

(52) U.S. Cl.
CPC .. *H01L 21/31111* (2013.01); *H01L 21/02063* (2013.01); *H01L 21/3105* (2013.01); *H01L 21/31116* (2013.01); *H01L 21/67069* (2013.01); *H01L 21/67173* (2013.01); *H01L 21/67207* (2013.01); *H01L 21/67742* (2013.01); *H01L 21/67745* (2013.01); *H01L 21/67748* (2013.01)

(58) Field of Classification Search
CPC ........ H01L 21/31111; H01L 21/67173; H01L 21/67207; H01L 21/67069; H01L 21/02063; H01L 21/67742; H01L 21/67745; H01L 21/67748; H01L 21/31116; H01L 21/3105
See application file for complete search history.

(56) References Cited

U.S. PATENT DOCUMENTS

| | | |
|---|---|---|
| 6,162,370 A | 12/2000 | Hackett et al. |
| 2007/0048916 A1 | 3/2007 | Suzuki et al. |

(Continued)

FOREIGN PATENT DOCUMENTS

| | | |
|---|---|---|
| JP | 2005-019787 A | 1/2005 |
| JP | 2005-39185 A | 2/2005 |
| JP | 2007-266490 A | 10/2007 |

(Continued)

*Primary Examiner* — Anita K Alanko
(74) *Attorney, Agent, or Firm* — Nath, Goldberg & Meyer; Jerald L. Meyer

(57) ABSTRACT

An etching method of etching a silica-based residue containing a base component formed in an $SiO_2$ film, includes selectively etching the silica-based residue by supplying an HF gas, an $H_2O$ gas or an alcohol gas to a target substrate having the $SiO_2$ film, on which the silica-based residue is formed, and removing an etching residue caused by the selectively etching the silica-based residue, after the selectively etching the silica-based residue. The removing an etching residue includes a first process of supplying an $H_2O$ gas or an alcohol gas to the target substrate and a second process of heating the target substrate after the first process.

19 Claims, 11 Drawing Sheets

(56) References Cited

U.S. PATENT DOCUMENTS

2010/0237046 A1* 9/2010 Kent .................. B05B 12/12
216/58
2016/0196984 A1* 7/2016 Lill .................. C23C 16/458
438/694

FOREIGN PATENT DOCUMENTS

| JP | 2008-160000 A | 7/2008 |
| JP | 2016-25195 A | 2/2016 |
| KR | 10-2014-0027862 A | 3/2014 |
| KR | 1020160084313 A | 7/2016 |

* cited by examiner

ETCHING METHOD AND RESIDUE REMOVAL METHOD

CROSS-REFERENCE TO RELATED APPLICATION

This application is based upon and claims the benefit of priority from Japanese Patent Application No. 2017-133039, filed on Jul. 6, 2017, the entire contents of which are incorporated herein by reference.

TECHNICAL FIELD

The present disclosure relates to an etching method of chemically etching a silicon oxide film and a residue removal method of removing residue.

BACKGROUND

Recently, as an etching method for realizing miniaturization in the manufacturing process of a semiconductor device, a method called chemical oxide removal (COR) process, which chemically performs etching without generating plasma in a chamber, has attracted attention in place of plasma etching.

As the COR, a process is known in which a hydrogen fluoride (HF) gas and an ammonia ($NH_3$) gas are adsorbed to a silicon oxide film ($SiO_2$ film) existing on the surface of a semiconductor wafer as a target substrate in a chamber kept in a vacuum state and are reacted with the silicon oxide film to generate ammonium fluorosilicate (($NH_4)_2SiF_6$; AFS), and in a subsequent process, the $SiO_2$ film is etched by sublimating the ammonium fluorosilicate by heating.

On the other hand, for example, in the manufacturing process of a 3D-NAND type nonvolatile semiconductor device, there is a process in which after an $SiO_2$ film and a silicon nitride film (SiN film) formed by a chemical vapor deposition (CVD) method are stacked in multiple layers, the SiN film is removed by wet etching using thermal phosphoric acid ($H_3PO_4$) to form a cavity for forming a tungsten electrode. At this time, after the SiN film is removed, a low density and porous silica ($SiO_2$)-based residue containing an impurity (P, N, S, Si, or the like) is precipitated at a leading end of the $SiO_2$ film (CVD-$SiO_2$ film) represented by a TEOS film formed by the CVD.

When this $SiO_2$-based residue is removed with an HF gas and an $NH_3$ gas by the conventional method, the CVD-$SiO_2$ film may also be etched. On the other hand, another conventional method discloses a technique capable of etching a CVD-$SiO_2$ film having a relatively low density with high selectivity with respect to a thermal oxide film having a relatively high density with an HF gas, an alcohol gas or water vapor. Using this technique, consideration is given to selectively remove a silica ($SiO_2$)-based residue having a low density even in the same $SiO_2$ film with respect to the CVD-$SiO_2$ film.

However, after the process of removing the silica-based residue existing at the leading end of the CVD-$SiO_2$ film using such technique, when the residue is removed by heat treatment, it was found that a block oxide film (block $SiO_2$ film) having a lower density than the CVD-$SiO_2$ film existing at the back of the CVD-$SiO_2$ film may be damaged.

SUMMARY

The present disclosure provides some embodiments of an etching method which is less likely to damage a remaining $SiO_2$ film even when an etching residue is removed after etching a silica-based residue, and a residue removal method.

According to one embodiment of the present disclosure, there is provided an etching method of etching a silica-based residue containing a base component formed in an $SiO_2$ film, includes selectively etching the silica-based residue by supplying an HF gas, an $H_2O$ gas or an alcohol gas to a target substrate having the $SiO_2$ film, on which the silica-based residue is formed, and removing an etching residue caused by the selectively etching the silica-based residue, after the selectively etching the silica-based residue. The removing an etching residue includes a first process of supplying an $H_2O$ gas or an alcohol gas to the target substrate and a second process of heating the target substrate after the first process.

According to one embodiment of the present disclosure, there is provided a method of removing an etching residue containing a fluorine component and a base component adhered to an $SiO_2$ film, including removing the fluorine component by supplying an $H_2O$ gas or an alcohol gas to a target substrate having the $SiO_2$ film; and removing the remainder of the etching residue by heating the target substrate after the removing the fluorine component.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

An embodiment of the present disclosure will now be described with reference to the drawings.

<Etching Method>

First, an etching method according to one embodiment of the present disclosure will be described. Here, a method of etching and removing a silica-based residue existing at a leading end of a CVD-$SiO_2$ film after removing an SiN film in a manufacturing process of a 3D-NAND type nonvolatile semiconductor device will be described.

Figure 1:
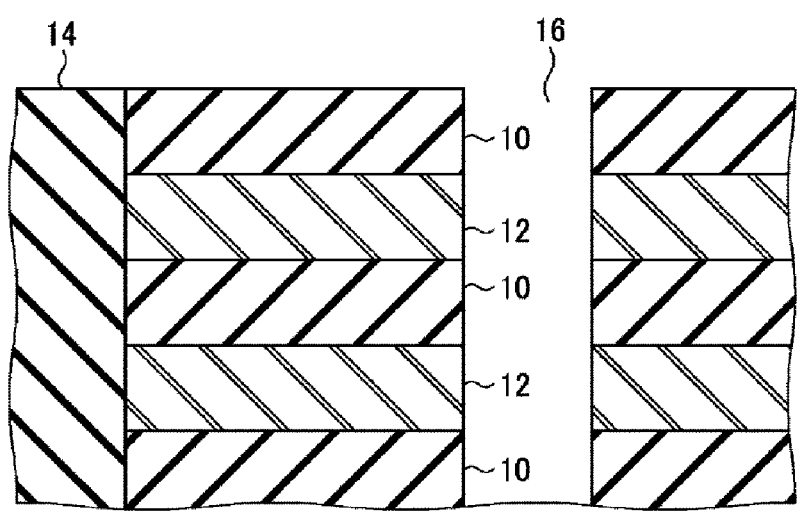
FIG. 1 is a cross-sectional view illustrating a state before an SiN film is removed in a manufacturing process of a 3D-NAND type nonvolatile semiconductor device.

FIG. 1 is a cross-sectional view illustrating a state before an SiN film is removed in a manufacturing process of a 3D-NAND type nonvolatile semiconductor device, which has a structure in which CVD-$SiO_2$ films 10 and CVD-SiN films 12 are alternately stacked and in which an initially formed block oxide film (block $SiO_2$ film) 14 embedded in a groove and a groove 16, which are perpendicular to these films, is formed.

As the CVD-$SiO_2$ films, it may be possible to use a TEOS film formed using tetraethoxysilane (TEOS) as an Si precursor. Similarly, the block oxide film 14 is also an $SiO_2$ film formed by CVD, but it has more impurity and lower density than the CVD-$SiO_2$ films 10.

Figure 2:
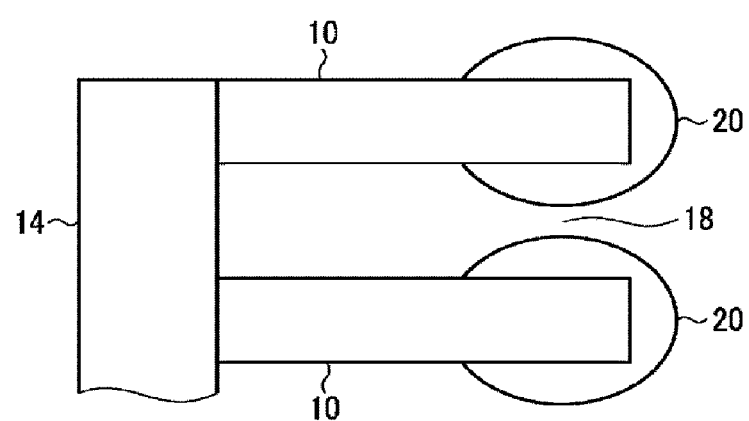
FIG. 2 is a view schematically illustrating a state in which a silica-based residue is grown in a CVD-$SiO_2$ film when an SiN film is etched from the state of FIG. 1 by wet etching.

In this state, the CVD-SiN films 12 are removed by wet etching using thermal phosphoric acid ($H_3PO_4$) to form a cavity 18 for forming a tungsten electrode, as illustrated in FIG. 2.

At this time, low density and porous silica ($SiO_2$)-based residues 20 containing an impurity (P, N, S, Si, or the like) regrow at leading ends of the CVD-$SiO_2$ films 10. In the present embodiment, these silica-based residues 20 are etched and removed by a COR process.

Both the CVD-$SiO_2$ films 10 and the silica-based residues 20 contain $SiO_2$ as a main component. In this etching, the silica-based residues 20 need to be etched with high selectivity with respect to the CVD-$SiO_2$ films 10. Since the silica-based residues 20 are lower in density than the CVD-$SiO_2$ films 10, the silica-based residues 20 can be etched and removed with high selectivity with respect to the CVD-$SiO_2$ films 10 based on the aforementioned conventional method.

That is, in the present embodiment, a semiconductor wafer (hereinafter, also referred to simply as a wafer) as a target substrate, on which the silica-based residues 20 are formed at the leading ends of the CVD-$SiO_2$ films 10 as illustrated in FIG. 2, is accommodated in the chamber. Then, an HF gas, an $H_2O$ gas (water vapor) or an alcohol gas is introduced into the chamber and is subjected to the COR process, thereby etching the silica-based residues 20 with high selectivity. An inert gas may be further added to these gases. As the inert gas, it may be possible to use an $N_2$ gas or a rare gas such as Ar, He or the like.

Each of the $H_2O$ gas and the alcohol gas contains an OH group, and this OH group exerts an etching action together with the HF gas. The action of the OH group at this time is larger to the silica-based residues 20 having a relatively lower density than to the CVD-$SiO_2$ films 10 having a relatively high density. Thus, the silica-based residues 20 can be selectively etched with respect to the CVD-$SiO_2$ films 10.

In addition, since the block oxide film 14 is also formed by CVD, it is higher in density than the silica-based residues 20, and the silica-based residues 20 can also be selectively etched with respect to the block oxide film 14.

The pressure in this etching in some embodiments is within a range of preferably 133 to 666 Pa (1 to 5 Torr), more preferably, 266 to 533 Pa (2 to 4 Torr). In addition, it is desirable that the wafer temperature at this time be within a range of 10 to 30 degrees C., in some embodiments.

Furthermore, the flow rate ratio (volume ratio) of the $H_2O$ gas or the alcohol gas to the total amount of the HF gas+$H_2O$ gas or alcohol gas is within a range of preferably 10 to 50%, more preferably, 15 to 30%, in some embodiments.

It is desirable that the alcohol gas be monohydric alcohol such as methanol ($CH_3OH$), ethanol ($C_2H_5OH$), propanol ($C_3H_7OH$), butanol ($C_4H_9OH$) or the like, in some embodiments. Among these, ethanol is desirable.

Figure 3:
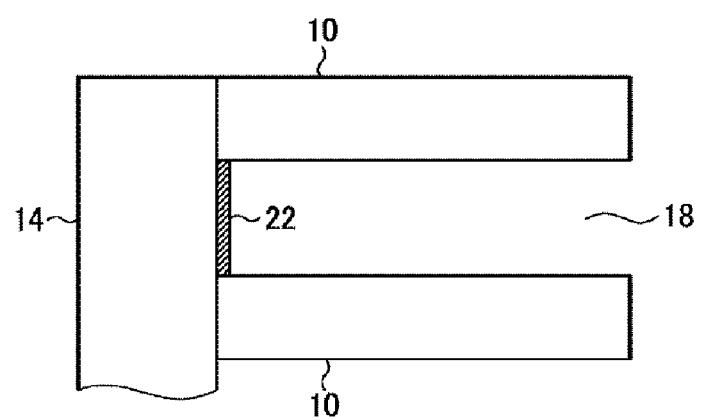
FIG. 3 is a view schematically illustrating a state in which an etching residue exists when a silica-based residue formed in a CVD-$SiO_2$ film is etched by a COR process.

After this etching process, since an etching residue 22 is formed on the surface of the block oxide film 14 as illustrated in FIG. 3, the etching residue 22 is removed.

Figure 4:
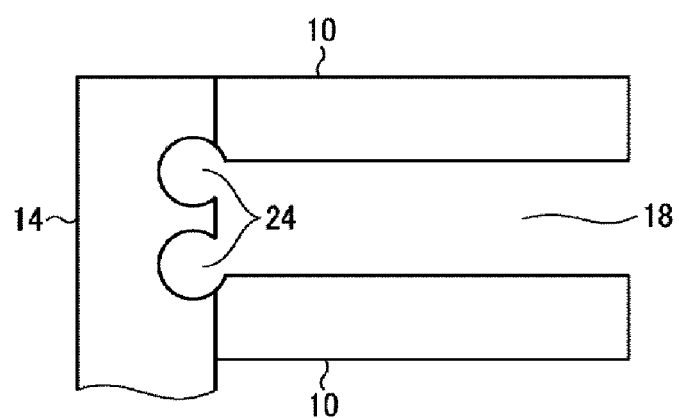
FIG. 4 is a schematic view illustrating damage of block oxide when an etching residue is removed by heat treatment.

This type of removing an etching residue is generally performed by heating the wafer. However, in the case of this example, it was found that when the heat treatment is performed directly after the etching process of the silica-based residues 20, recesses 24 are mainly formed on the surface of the block oxide film 14, as illustrated in FIG. 4.

As a result of studying the cause of occurrence of the recesses 24 on the surface of the block oxide film 14 in this way, the following mechanism was assumed.

Figure 5:
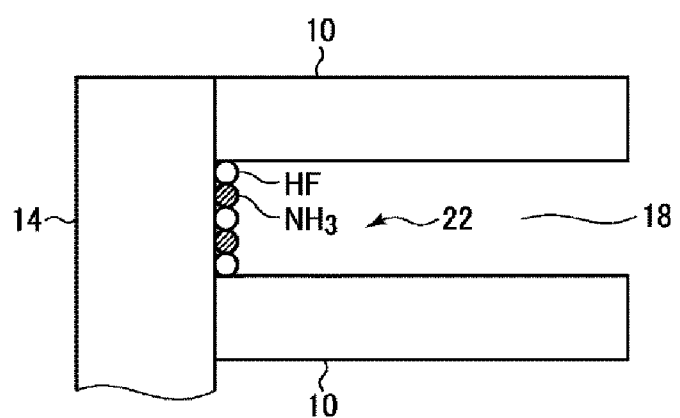
FIG. 5 is a schematic view illustrating components of an etching residue.

A base component such as $NH_3$ is contained as an impurity in the regrown silica-based residues 20, and after the etching process of the silica-based residues 20, the $NH_3$ remains on the surface of the block oxide film 14. Furthermore, when the etching process (COR process) is performed by the HF gas, the $H_2O$ gas or the alcohol gas, a fluorine component (F component) remains on the surface of the block oxide film 14. Therefore, as illustrated in FIG. 5, the etching residue 22 contains the base components and the F components. When the heat treatment is performed in this state, for example, the following reaction occurs on the surface of the block oxide film 14 made of $SiO_2$ so that the block oxide film 14 is mainly etched. Due to this influence, the leading ends of the CVD-$SiO_2$ films 10 may also be partially etched. $SiO_2+4HF+4NH_3 \rightarrow SiF_4+2H_2O+4NH_3$ Therefore, in the present embodiment, as the process of removing the etching residue after completion of the COR process using the HF gas, the $H_2O$ gas or the alcohol gas, a process of supplying an $H_2O$ gas or an alcohol gas is performed and thereafter the heat treatment process is performed. This makes it possible to suppress etching of the block oxide film 14.

Figure 6A:
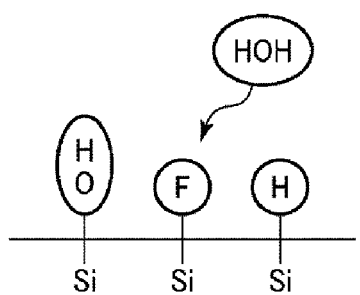
FIGS. 6A and 6B are views illustrating a mechanism for removing F bonded to the surface of a block oxide film by an $H_2O$ gas in a first process of removing an etching residue.
Figure 6B:
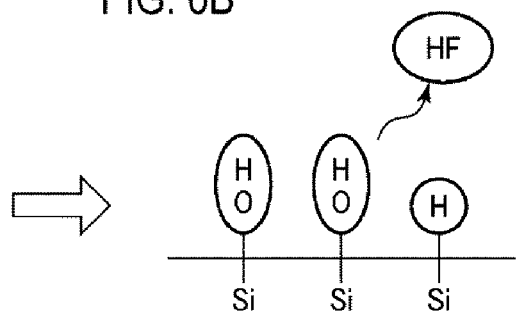
Figure 7:
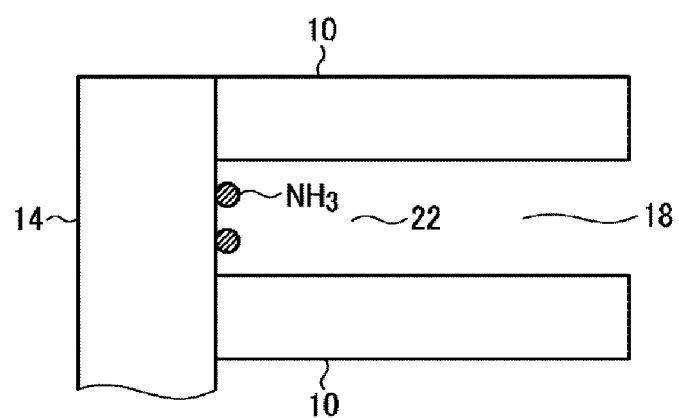
FIG. 7 is a schematic view illustrating a state of an etching residue after processing an $H_2O$ gas in the first process of removing an etching residue.

The mechanism will be described with reference to FIGS. 6A, 6B and 7. As illustrated in FIG. 6A, in addition to OH and H, F is bonded to Si on the surface of the block oxide film 14 made of $SiO_2$. In this state, for example, when $H_2O$ is supplied, as illustrated in FIG. 6B, F reacts with $H_2O$ to become HF, which will be volatilized, and OH bonds to a dangling bond of Si to which F has been bonded. Thus, the etching residue 22 on the surface of the block oxide film 14 is in a state in which the F components have been removed, as illustrated in FIG. 7. Even if the heat treatment is performed in this state, since F was removed from the surface of the block oxide film 14, the residue can be removed without generating a component of etching $SiO_2$, preventing damage to the block oxide film 14. In addition, even when the F components or the base components exist in the CVD-$SiO_2$ films 10, it is similarly possible to prevent damage. Even when alcohol is used instead of $H_2O$, it is also possible to prevent damage to the block oxide film 14 by the same mechanism.

The process of supplying the $H_2O$ gas or the alcohol gas, which is a first process of removing the residue, may be performed by stopping the supply of the HF gas and continuing to allow the $H_2O$ gas or the alcohol gas to flow in the chamber subjected to the COR process. At this time, by increasing the flow rate of the $H_2O$ gas or the alcohol gas, it is possible to remove F on the surface of the block oxide film 14 in a short time. It is desirable that the flow rate of the H₂O gas or the alcohol gas be within a range of 100 to 1,000 sccm, and the processing time period be within a range of 30 to 600 seconds, in some embodiments. Furthermore, the pressure and the temperature may be similar to those of the COR process.

Figure 8:
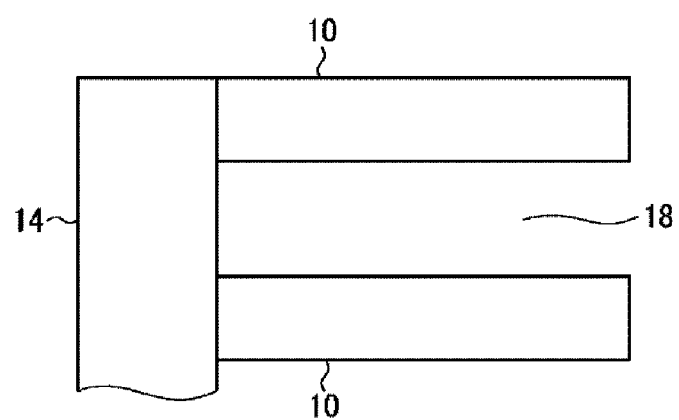
FIG. 8 is a schematic view illustrating a state after performing heat treatment in a second process of removing an etching residue is performed.

The heat treatment process which is a second process of removing the residue is performed in an inert gas atmosphere such as an $N_2$ gas or an Ar gas, preferably within a range of 150 to 230 degrees C., in some embodiments. Thus, the residue components that have not been removed in the first process, for example, the base components or the like such as $NH_3$, are removed, and as illustrated in FIG. 8, the etching residue 22 can be removed without causing damage to the block oxide film 14. It is desirable that the time period of the second process at this time be within a range of 30 to 600 seconds, in some embodiments.

Actually, as described above, as a result of removing the residue in two stages after the COR process, it was confirmed that the etching residue 22 is removed without causing damage to the block oxide film 14 or the CVD-SiO₂ films 10, which are the SiO₂ film.

<Example of Processing System for Use in Etching Method of Present Embodiment>

Next, an example of a processing system for use in the etching method of the present embodiment will be described.

Figure 9:
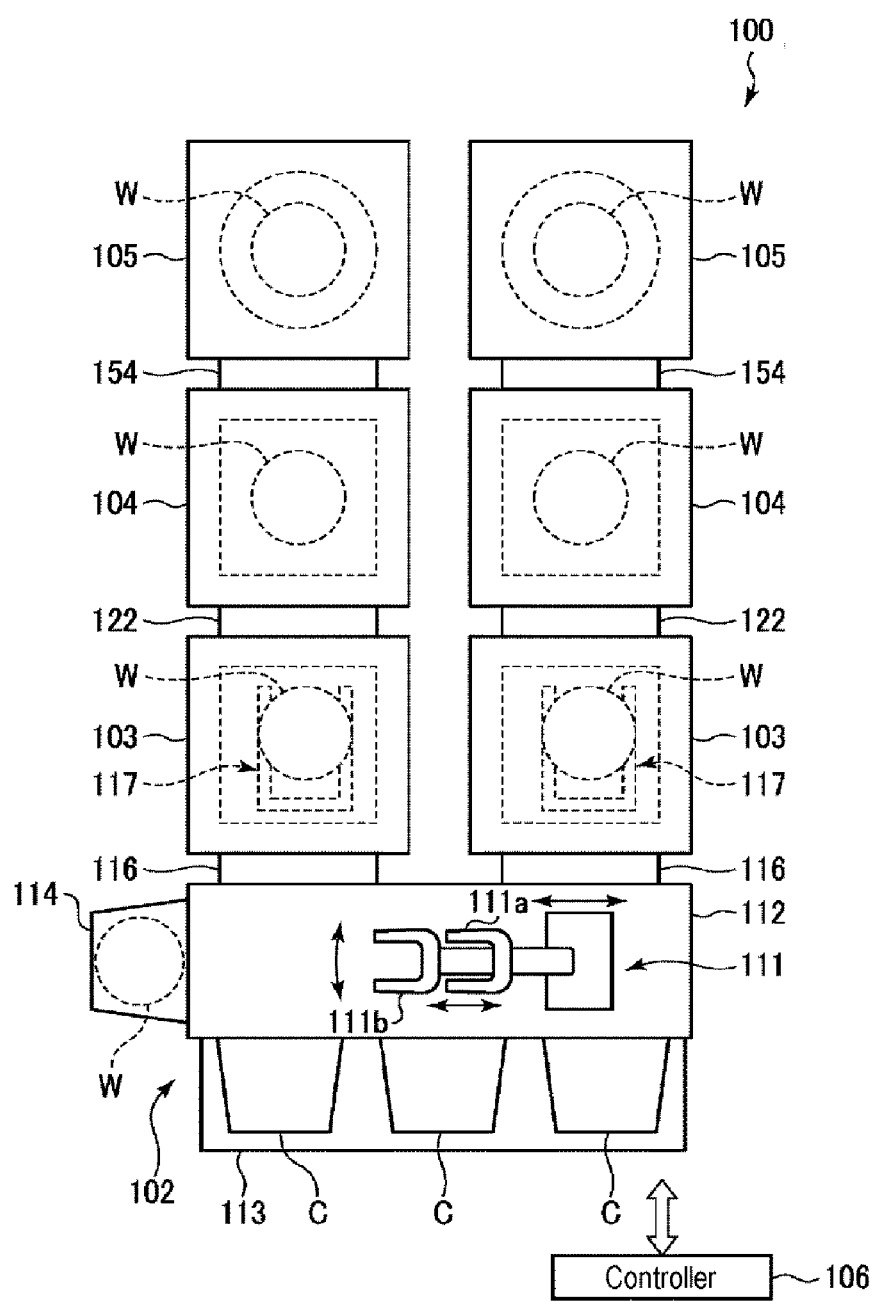
FIG. 9 is a schematic configuration diagram illustrating an example of a processing system for use in an etching method according to one embodiment of the present disclosure.

FIG. 9 is a schematic configuration diagram illustrating an example of a processing system for use in the etching method of the present embodiment. A processing system 100 includes a loading/unloading part 102 for loading and unloading wafers W having a structure in which the silica-based residues 20 are formed at the leading ends of the CVD-SiO₂ films 10 after removal of the SiN film as described above, two load lock chambers 103 installed adjacent to the loading/unloading part 102, heat treatment devices 104 which are installed adjacent to the respective load lock chambers 103 and performs heat treatment on the wafers W, COR processing devices 105 which are installed adjacent to the respective heat treatment devices 104 and performs etching (COR process) on the wafers W, and a controller 106.

The loading/unloading part 102 has a transfer chamber 112 in which a first wafer transfer mechanism 111 for transferring the wafers W is installed. The first wafer transfer mechanism 111 has two transfer arms 111a and 111b for substantially horizontally holding the wafers W. A loading table 113 is installed on the lateral side of the transfer chamber 112 in a longitudinal direction, and for example, three carriers C for accommodating the wafers W such as FOUP may be connected to the loading table 113. In addition, an alignment chamber 114 for aligning the wafers W is installed adjacent to the transfer chamber 112.

In the loading/unloading part 102, the wafers W are held by the transfer arms 111a and 111b and are linearly moved and elevated in a substantially horizontal plane by driving the first wafer transfer mechanism 111 so as to be transferred to a desired position. Then, the transfer arms 111a and 111b move forward and backward with respect to the carriers C, the alignment chamber 114, and the load lock chambers 103 on the loading table 113, respectively, for loading and unloading of the wafers W.

The respective load lock chambers 103 are connected to the transfer chamber 112, with gate valves 116 interposed between the respective load lock chambers 103 and the transfer chamber 112. Second wafer transfer mechanisms 117 for transferring the wafers W are installed in the respective load lock chambers 103. Furthermore, the load lock chambers 103 are configured to be vacuumized to a predetermined degree of vacuum.

The second wafer transfer mechanism 117 has a multi joint arm structure and also has a pick that substantially horizontally holds the wafer W. In this second wafer transfer mechanism 117, the pick is positioned in the load lock chamber 103 with the multi-joint arm contracted, and the pick reaches the heat treatment device 104 by extending the multi-joint arm and reaches the COR processing device 105 by further extending the multi-joint arm. Thus, the wafer W can be transferred between the load lock chamber 103, the heat treatment device 104, and the COR processing device 105.

The controller 106 is typically configured as a computer, and has a main controller having a CPU for controlling the respective components of the processing system 100, an input device (a keyboard, a mouse or the like), an output device (a printer or the like), a display device (a display or the like), and a storage device (a storage medium). The main controller of the controller 106 causes the processing system 100 to execute a predetermined operation, for example, based on a process recipe stored in the storage medium incorporated in the storage device or the storage medium set in the storage device.

In this processing system 100, the wafers W having a structure in which the silica-based residues 20 are formed at the leading ends of the CVD SiO₂ films 10 after removal of the SiN film, as illustrated in FIG. 2, are accommodated in the carriers C and transferred to the processing system 100. In the processing system 100, one wafer W is transferred from the carrier C of the loading/unloading part 102 to the load lock chamber 103 and is delivered to the pick of the second wafer transfer mechanism 117 in the load lock chamber 103, with the gate valve 116 on an atmospheric side opened, by one of the transfer arms 111a and 111b of the first wafer transfer mechanism 111.

Thereafter, the gate valve 116 on the atmospheric side is closed and the interior of the load lock chamber 103 is vacuum-exhausted, and then the gate valve 154 is opened to allow the pick to extend to the COR processing device 105 and the wafer W is transferred to the COR processing device 105.

Thereafter, the pick is returned to the load lock chamber 103, the gate valve 154 is closed, and the silica-based residues are removed by the COR process described above in the COR processing device 105. After the COR process is completed, the first process of removing the residue as described above is performed by the COR processing device 105.

After the first process of removing the residue is completed, the gate valves 122 and 154 are opened, the wafer W after the etching process is transferred to the heat treatment device 104 by the pick of the second wafer transfer mechanism 117, and the heat treatment of the second process of removing the residue is performed.

After the heat treatment in the heat treatment device 104 is completed, the wafer W is returned to the carrier C by one of the transfer arms 111a and 111b of the first wafer transfer mechanism 111. Thus, the processing of one wafer is completed.

<COR Processing Device>

Next, an example of the COR processing device 105 mounted in the processing system 100 will be described in detail.

Figure 10:
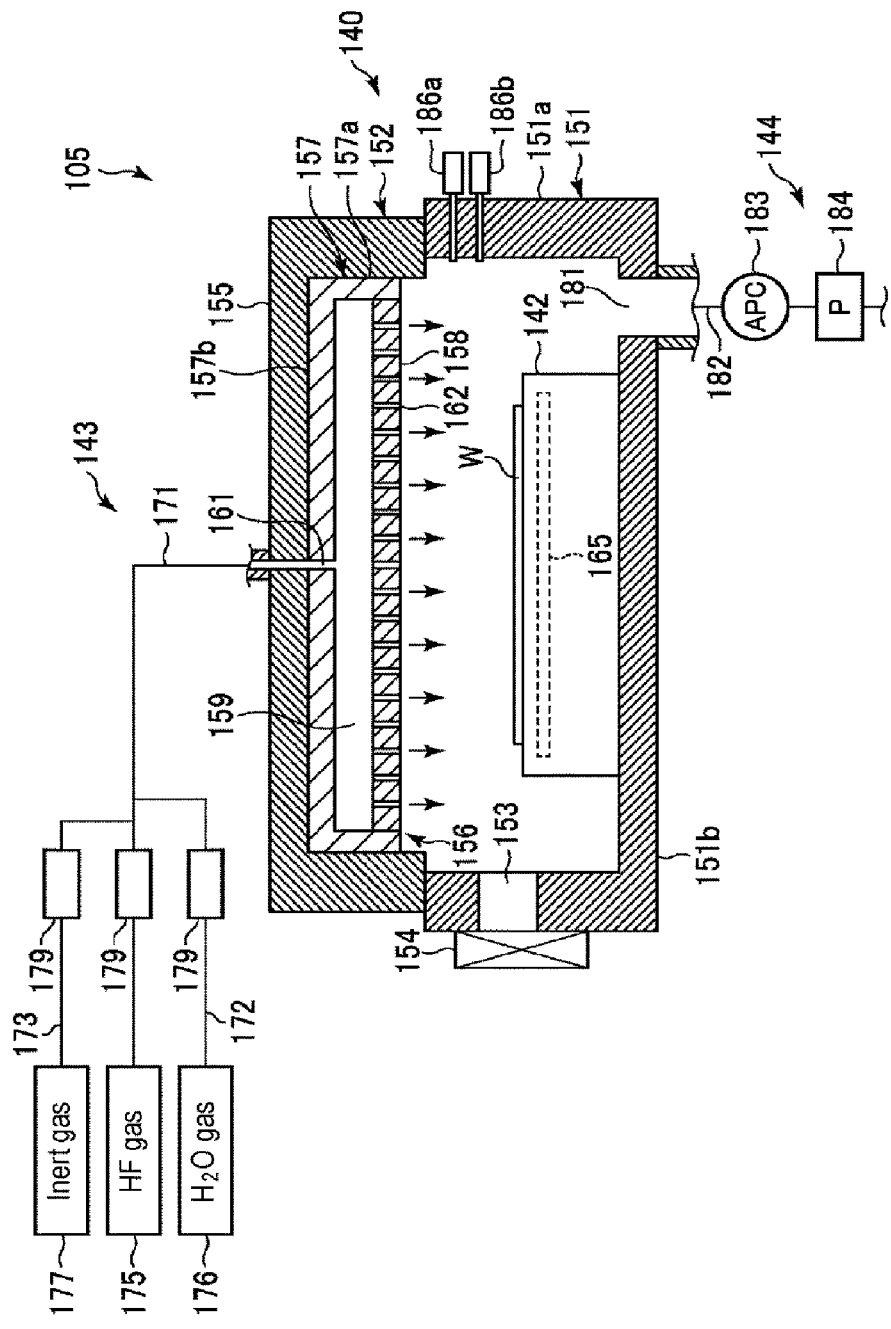
FIG. 10 is a cross-sectional view illustrating a COR processing device mounted in the processing system of FIG. 9.

FIG. 10 is a cross-sectional view illustrating an example of the COR processing device 105. As illustrated in FIG. 10, the COR processing device 105 has a chamber 140 having a sealed structure, and a loading table 142 for loading a wafer W in a substantially horizontal state is installed in the chamber 140. In addition, the COR processing device 105 has a gas supply mechanism 143 for supplying a processing gas to the chamber 140, and an exhaust mechanism 144 for exhausting the interior of the chamber 140.

The chamber 140 is configured by a chamber body 151 and a lid 152. The chamber body 151 has a substantially cylindrical sidewall portion 151a and a bottom portion 151b, in which an opening is formed in an upper portion of the chamber body, and this opening is closed by the lid 152. The sidewall portion 151a and the lid 152 are hermetically sealed by a seal member (not shown) to secure the airtightness in the chamber 140.

The lid 152 has a lid member 155 constituting the outside, and a shower head 156 inserted into the inside of the lid member 155 and installed so as to face the loading table 142. The shower head 156 has a main body 157 having a cylindrical sidewall 157a and an upper wall 157b, and a shower plate 158 installed at a bottom portion of the main body 157. A space 159 is formed between the main body 157 and the shower plate 158.

A gas introduction path 161 is formed on the upper wall 157b of the lid member 155 and the main body 157 so as to penetrate to the space 159, an HF gas supply pipe 171 of the gas supply mechanism 143, which will be described later, is connected to the gas introduction path 161.

A plurality of gas discharge holes 162 are formed in the shower plate 158 such that the gas introduced into the space 159 via a gas supply pipe 171 and the gas introduction path 161 is discharged from the gas discharge holes 162 to the space in the chamber 140.

A loading/unloading port 153 for loading and unloading the wafer W between the sidewall portion 151a and the heat treatment device 104 is installed in the sidewall portion 151a, and the loading/unloading port 153 can be opened and closed by the gate valve 154.

The loading table 142 is substantially circular when viewed from a plan view, and is fixed to the bottom portion 151b of the chamber 140. A temperature adjuster 165 for adjusting the temperature of the loading table 142 is installed inside the loading table 142. The temperature adjuster 165 has a conduit through which, for example, a temperature adjusting medium (for example, water or the like) circulates, and heat exchange is performed with the temperature adjusting medium flowing through such a conduit. Thus, the temperature of the loading table 142 is adjusted and the temperature of the wafer W on the loading table 142 is controlled.

The gas supply mechanism 143 has an HF gas supply source 175 for supplying an HF gas, an $H_2O$ gas supply source 176 for supplying an $H_2O$ gas, and an inert gas supply source 177 for supplying an inert gas such as an $N_2$ gas or an Ar gas, to which ends of the HF gas supply pipe 171, an $H_2O$ gas supply pipe 172, and an inert gas supply pipe 173 are respectively connected. A flow rate controller 179 for performing the opening/closing operation of the flow path and the control of the flow rate is installed in the HF gas supply pipe 171, the $H_2O$ gas supply pipe 172, and the inert gas supply pipe 173. The flow rate controller 179 is configured by, for example, an opening/closing valve and a mass flow controller. The other end of the HF gas supply pipe 171 is connected to the gas introduction path 161, as described above. The other ends of the $H_2O$ gas supply pipe 172 and the inert gas supply pipe 173 are also connected to the HF gas supply pipe 171.

These gases are supplied to the shower head 156 and discharged from the gas discharge holes 162 of the shower head 156 toward the wafer W in the chamber 140.

As described above, an alcohol gas may also be supplied instead of the $H_2O$ gas. Furthermore, the inert gas is used as a dilution gas or a purge gas for purging the interior of the chamber 140. The dilution gas may not be used for processing.

The exhaust mechanism 144 has an exhaust pipe 182 connected to an exhaust port 181 formed at the bottom portion 151b of the chamber 140, and further has an automatic pressure control (APC) valve 183 for controlling the internal pressure of the chamber 140 and a vacuum pump 184 for exhausting the interior of the chamber 140, installed in the exhaust pipe 182.

Two capacitance manometers 186a and 186b, which are pressure gauges for measuring the internal pressure of the chamber 140, are installed on the sidewall of the chamber 140 so as to be inserted into the chamber 140. The capacitance manometer 186a is for high pressure and the capacitance manometer 186b is for low pressure. A temperature sensor (not shown) for detecting the temperature of the wafer W is installed near the wafer W loaded on the loading table 142.

In this COR processing device 105, the wafer W having a structure in which the silica-based residues 20 are formed at the leading ends of the CVD-$SiO_2$ films 10 after removal of the SiN film as described above is carried into the chamber 140 and loaded on the loading table 142. In some embodiments, the internal pressure of the chamber 140 is set at preferably 133 to 666 Pa (1 to 5 Torr), more preferably, 266 to 533 Pa (2 to 4 Torr), the temperature of the wafer W is preferably set at 10 to 30 degrees C., the HF gas and the $H_2O$ gas are preferably supplied at the flow rates of 500 to 1,500 sccm and 100 to 1,000 sccm respectively, and the inert gas as a dilution gas is set at 0 to 500 sccm to remove the silica-based residues by etching.

After removing the silica-based residue, the supply of the HF gas is stopped while holding the wafer W on the loading table 142 in the chamber 140, the $H_2O$ gas is set at 100 to 1,000 sccm, and the inert gas as the dilution gas is set at 0 to 500 sccm. Then, the first process of removing the etching residue after removing the silica-based residue by etching is preferably performed for 30 to 600 seconds in some embodiments. Thus, the F components in the etching residue are removed.

<Heat Treatment Device>

Next, an example of the heat treatment device 104 mounted in the processing system 100 will be described in detail.

Figure 11:
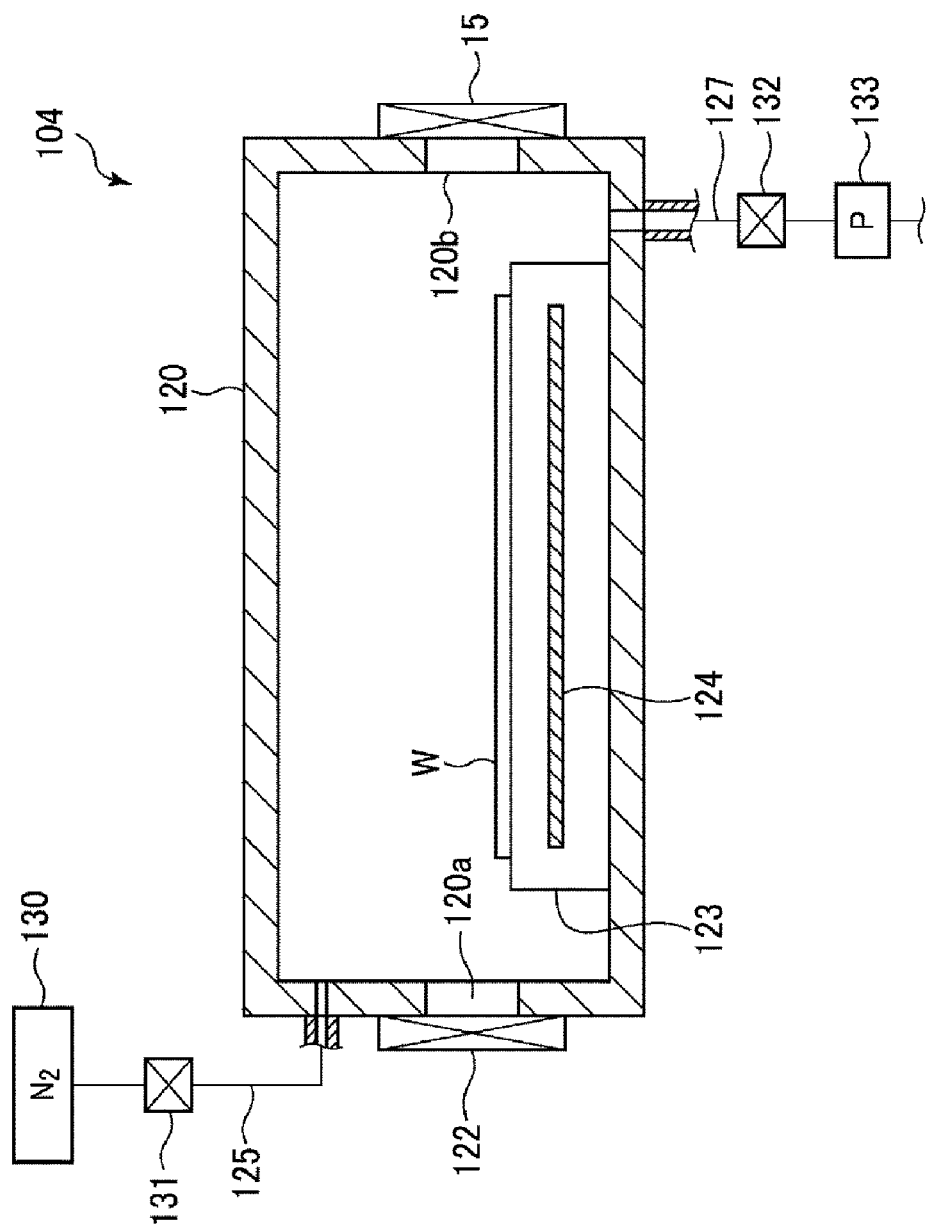
FIG. 11 is a cross-sectional view illustrating a heat treatment device mounted in the processing system of FIG. 9.

FIG. 11 is a cross-sectional view illustrating an example of the heat treatment device 104. As illustrated in FIG. 11, the heat treatment device 104 has a vacuumable chamber 120 and a loading table 123 on which a wafer W is loaded, and a heater 124 is embedded in the loading table 123. The wafer W subjected to the first process of removing the etching residue is heated by the heater 124 to remove the etching residue remaining on the wafer W by vaporization.

A loading/unloading port 120a for transferring the wafer into and out of the load lock chamber 103 is installed on the load lock chamber 103 side of the chamber 120 such that the loading/unloading port 120a can be opened and closed by a gate valve 122. In addition, a loading/unloading port 120b for transferring the wafer W into and out of the COR processing device 105 is installed on the COR processing device 105 side of the chamber 120 such that the loading/ unloading port 120b can be opened and closed by a gate valve 154.

A gas supply path 125 is connected to an upper portion of the sidewall of the chamber 120, and the gas supply path 125 is connected to an $N_2$ gas supply source 130 for supplying an $N_2$ gas as an inert gas. Furthermore, an exhaust path 127 is connected to a bottom wall of the chamber 120, and the exhaust path 127 is connected to a vacuum pump 133. A flow rate adjusting valve 131 is installed in the gas supply path 125 and a pressure regulating valve 132 is installed in the exhaust path 127. By adjusting these valves, heat treatment is performed by setting the interior of the chamber 120 to become an $N_2$ gas atmosphere of a predetermined pressure. An inert gas other than the $N_2$ gas, such as an Ar gas, may be used.

In this heat treatment device 104, the wafer W subjected to the first process of removing the etching residue in the COR processing device 105 is carried into the chamber 120 and loaded on the loading table 123. In some embodiments, the internal pressure of the chamber 120 is preferably set at 133 to 666 Pa (1 to 5 Torr) and the temperature of the wafer W is preferably set at 150 to 230 degrees C. while supplying the $N_2$ gas at a predetermined flow rate, and the wafer W subjected to the first process of removing the etching residue is heat-treated by the heater 124 to remove the etching residue remaining on the wafer W by vaporization.

In this case, since the F components of the etching residue are removed in the first process of removing the etching residue, it is possible to prevent damage to the block oxide film by the heat treatment.

Other Applications

While the embodiment of the present disclosure has been described above, the present disclosure is not limited to the aforementioned embodiment but may be differently modified without departing from the spirit of the present disclosure.

For example, in the aforementioned embodiment, the present disclosure is applied when the silica-based residues existing at the leading ends of the CVD-$SiO_2$ films after removal of the SiN film in the manufacturing process of a 3D-NAND type nonvolatile semiconductor device are removed by etching. However, the present disclosure is applied to any case of removing the silica-based residues containing basic components formed in the $SiO_2$ films, and the $SiO_2$ films are not limited to the CVD-$SiO_2$ films but may be a thermal oxide film. Furthermore, the present disclosure may be applied to any case of removing the etching residue of the basic components and the F components adhered to the $SiO_2$ films by CVD, regardless of the type of etching. In addition, in the present disclosure, the $SiO_2$ films formed by CVD include those formed by an atomic layer deposition (ALD) method. Moreover, in the aforementioned embodiment, the TEOS film is exemplified as the CVD-$SiO_2$ film, but it may be another $SiO_2$ film using an Si precursor.

Furthermore, the structure of the aforementioned processing system or individual devices is merely an example, and the etching method of the present disclosure may be realized by systems or devices having different configurations.

According to the present disclosure in some embodiments, it is possible to remove fluorine components in a first process and to suppress damage to $SiO_2$ films remaining on a target substrate by subsequent heating, by performing the first process of supplying an HF gas, an $H_2O$ gas or an alcohol gas to selectively etch silica-based residues and thereafter supplying an $H_2O$ gas or an alcohol gas to the target substrate when removing an etching residue, and a second process of heating the target substrate after the first process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method of etching a silica-based residue containing a base component formed in an $SiO_2$ film, comprising:
    selectively etching the silica-based residue by supplying an HF gas and at least one of an $H_2O$ gas and an alcohol gas to a target substrate having the $SiO_2$ film, on which the silica-based residue is formed; and
    removing an etching residue caused by the selectively etching the silica-based residue, after the selectively etching the silica-based residue,
    wherein the removing an etching residue includes:
        a first process of supplying an $H_2O$ gas or an alcohol gas to the target substrate to react with a fluorine component of the etching residue and generate HF that is to be volatilized; and
        a second process of heating the target substrate after the first process to remove the remainder of the etching residue.

2. The method of claim 1, wherein the silica-based residue containing the base component is formed when removing a silicon nitride film formed on the target substrate by wet etching using thermal phosphoric acid.

3. The method of claim 1, wherein the $SiO_2$ film is a CVD-$SiO_2$ film formed by CVD.

4. The method of claim 3, wherein the target substrate further has a block $SiO_2$ film having a lower density than the CVD-$SiO_2$ film and formed by CVD, supporting the CVD-$SiO_2$ film, and wherein a plurality of CVD-$SiO_2$ films extend at intervals from the block $SiO_2$ film.

5. The method of claim 1, wherein the selectively etching the silica-based residue is performed by supplying the HF gas and at least one of the $H_2O$ gas and the alcohol gas in a chamber in which the target substrate is disposed, and the first process of the removing an etching residue is performed by stopping the supply of the HF gas and supplying only the $H_2O$ gas or the alcohol gas to the chamber in a state in which the target substrate is disposed in the chamber.

6. The method of claim 1, wherein the selectively etching the silica-based residue is performed under a condition of a pressure of 133 to 666 Pa and a temperature of 0 to 30 degrees C.

7. The method of claim 1, wherein in the selectively etching the silica-based residue, a flow rate ratio (volume ratio) of the $H_2O$ gas or the alcohol gas to a total amount of the HF gas+$H_2O$ gas or alcohol gas is within a range of 10 to 50%.

8. The method of claim 1, wherein in the first process of the removing an etching residue, a flow rate of the $H_2O$ gas or the alcohol gas is within a range of 100 to 1,000 sccm.

9. The method of claim 1, wherein the first process of the removing an etching residue is performed at a temperature within a range of 10 to 30 degrees C.

10. The method of claim 1, wherein a time period of the first process of the removing an etching residue is within a range of 5 to 60 seconds.

11. The method of claim 1, wherein the second process of the removing an etching residue is performed at a temperature within a range of 150 to 230 degrees C.

12. The method of claim 1, wherein a time period of the second process of the removing an etching residue is within a range of 30 to 600 seconds.

13. The method of claim 1, wherein the etching residue contains the fluorine component and a base component, and the fluorine component is removed from the etching residue in the first process of the removing an etching residue.

14. A method of removing an etching residue containing a fluorine component and a base component adhered to an SiO2 film of a target substrate, comprising:

removing the fluorine component of the etching residue by supplying an H$_2$O gas or an alcohol gas to the target substrate to react with the fluorine component of the etching residue and generate HF that is to be volatilized; and removing the remainder of the etching residue by heating the target substrate after the removing the fluorine component.

15. The method of claim 14, wherein the removing the fluorine component is performed at a temperature within a range of 10 to 30 degrees C.

16. The method of claim 14, wherein a time period of the removing the fluorine component is within a range of 5 to 60 seconds.

17. The method of claim 14, wherein the removing the remainder is performed at a temperature within a range of 150 to 230 degrees C.

18. The method of claim 14, wherein a time period of the removing the remainder is within a range of 30 to 600 seconds.

19. The method of claim 14, wherein the etching residue is formed by selectively etching a silica-based residue by supplying an HF gas and at least one of an H$_2$O gas and an alcohol gas to the target substrate.

* * * * *